United States Patent
Takeyama et al.

(10) Patent No.: US 12,392,026 B2
(45) Date of Patent: Aug. 19, 2025

(54) METHOD AND DEVICE FOR SUBSTRATE PROCESSING

(71) Applicant: TOKYO ELECTRON LIMITED, Tokyo (JP)

(72) Inventors: Tamaki Takeyama, Yamanashi (JP); Hiroaki Chihaya, Yamanashi (JP); Motoi Yamagata, Tokyo (JP); Manabu Nakagawasai, Tokyo (JP); Shinji Orimoto, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 527 days.

(21) Appl. No.: 17/638,736

(22) PCT Filed: Jul. 21, 2020

(86) PCT No.: PCT/JP2020/028289
§ 371 (c)(1),
(2) Date: Feb. 25, 2022

(87) PCT Pub. No.: WO2021/039218
PCT Pub. Date: Mar. 4, 2021

(65) Prior Publication Data
US 2022/0220606 A1    Jul. 14, 2022

(30) Foreign Application Priority Data
Aug. 29, 2019    (JP) ................. 2019-157145

(51) Int. Cl.
*C23C 14/54*    (2006.01)
*C23C 14/34*    (2006.01)
(Continued)

(52) U.S. Cl.
CPC ............ *C23C 14/541* (2013.01); *C23C 14/34* (2013.01); *C23C 14/505* (2013.01); *H01L 21/68764* (2013.01); *H01L 21/6833* (2013.01)

(58) Field of Classification Search
None
See application file for complete search history.

(56) References Cited

U.S. PATENT DOCUMENTS

| | | | |
|---|---|---|---|
| 5,084,671 A * | 1/1992 | Miyata | G01R 1/07314 165/80.4 |
| 5,328,558 A * | 7/1994 | Kawamura | H01L 21/31116 257/E21.252 |

(Continued)

FOREIGN PATENT DOCUMENTS

| | | |
|---|---|---|
| JP | H04-176121 A | 6/1992 |
| JP | 05-070948 A | 3/1993 |

(Continued)

OTHER PUBLICATIONS

PCT International Search Report and Written Opinion, PCT Application No. PCT/JP2020/028289, Sep. 24, 2020, 9 pages (with English translation of PCT International Search Report).

*Primary Examiner* — Sylvia MacArthur
(74) *Attorney, Agent, or Firm* — Fenwick & West LLP

(57) ABSTRACT

There is provided a method for processing a substrate, comprising: preparing a substrate processing device including a rotatable stage on which a substrate is placed, a frozen heat transfer body fixed on a backside of the stage with a gap interposed therebetween and cooled to an extremely low temperature, a gas supply mechanism configured to supply to the gap a cooling gas for transferring a cold heat of the frozen heat transfer body to the stage, a rotation mechanism configured to rotate the stage, and a processing mechanism configured to process the substrate; preheating the stage such that a temperature of the stage reaches a steady cooling temperature within a fixed range; and after preheating, continuously processing a plurality of substrates by the processing mechanism while rotating the stage that has reached the steady cooling temperature in a state where a (Continued)

substrate having a specific temperature higher than or equal to room temperature is placed on the stage.

20 Claims, 9 Drawing Sheets

(51) Int. Cl.
*C23C 14/50* (2006.01)
*H01L 21/687* (2006.01)
*H01L 21/683* (2006.01)

(56) References Cited

U.S. PATENT DOCUMENTS

| | | | |
|---|---|---|---|
| 5,478,429 A * | 12/1995 | Komino | H01J 37/32082 |
| | | | 118/724 |
| 9,355,878 B2 | 5/2016 | Abarra et al. | |
| 10,763,153 B2 | 9/2020 | Tashiro et al. | |
| 11,532,784 B2 * | 12/2022 | Nakagawasai | C23C 14/505 |
| 2014/0105709 A1 | 4/2014 | Abarra et al. | |
| 2019/0103301 A1 | 4/2019 | Tashiro et al. | |
| 2022/0220606 A1 * | 7/2022 | Takeyama | H01L 21/68792 |

FOREIGN PATENT DOCUMENTS

| | | |
|---|---|---|
| JP | H09-045751 A | 2/1997 |
| JP | 2000-272910 A | 10/2000 |
| JP | 2001-335927 A | 12/2001 |
| JP | 2014-078669 A | 5/2014 |
| JP | 2019-016771 A | 1/2019 |
| KR | 10-2018-0135040 A | 12/2018 |
| WO | WO 2017/221631 A1 | 12/2017 |

* cited by examiner

METHOD AND DEVICE FOR SUBSTRATE PROCESSING

TECHNICAL FIELD

The present disclosure relates to a method and device for substrate processing.

BACKGROUND

A processing apparatus for a substrate such as a semiconductor substrate or the like, e.g., a film forming apparatus, performs processing that requires an extremely low temperature. For example, a technique for forming a magnetic film in an ultra-high vacuum and ultra-low temperature environment is required to obtain a magnetoresistive element having a high magnetoresistive ratio.

As a technique for uniformly cooling a substrate at an extremely low temperature in an ultra-high vacuum environment, there is known one in which a stage on which a substrate is placed is rotatably provided, and a frozen heat transfer body is disposed at a center of a back surface of a stage with a gap interposed therebetween (see, e.g., Patent Document 1). Such technique uniformly cools the substrate to an extremely low temperature by supplying cold heat of a chiller to the stage via the frozen heat transfer body while supplying a cooling gas to the gap between the rotating stage and the frozen heat transfer body.

PRIOR ART DOCUMENTS

Patent Documents

Patent Document 1: Japanese Patent Application Publication No. 2019-016771

SUMMARY

Problems to Be Resolved by the Invention

The present disclosure provides a method and device for processing a substrate, capable of shortening a time required until a temperature of a substrate reaches a steady cooling temperature in the case of rotating and processing the substrate in a state where the substrate is cooled to an extremely low temperature.

Means of Solving the Problems

A method according to an aspect of the present disclosure is a method for processing a substrate, and comprises: preparing a substrate processing device including a rotatable stage on which a substrate is placed, a frozen heat transfer body fixed on a backside of the stage with a gap interposed therebetween and cooled to an extremely low temperature, a gas supply mechanism configured to supply to the gap a cooling gas for transferring a cold heat of the frozen heat transfer body to the stage, a rotation mechanism configured to rotate the stage, and a processing mechanism configured to process the substrate; preheating the stage such that a temperature of the stage reaches a steady cooling temperature within a fixed range; and after preheating, continuously processing a plurality of substrates by the processing mechanism while rotating the stage that has reached the steady cooling temperature in a state where a substrate having a specific temperature higher than or equal to room temperature is placed on the stage.

Effect of the Invention

In accordance with the present disclosure, there are provided a method and device for processing a substrate, capable of shortening a time required until a temperature of a substrate reaches a steady cooling temperature in the case of rotating and processing the substrate in a state where the substrate is cooled to an extremely low temperature.

DETAILED DESCRIPTION

Hereinafter, an embodiment will be described in detail with reference to the accompanying drawings.

<Processing Device>

Figure 1:
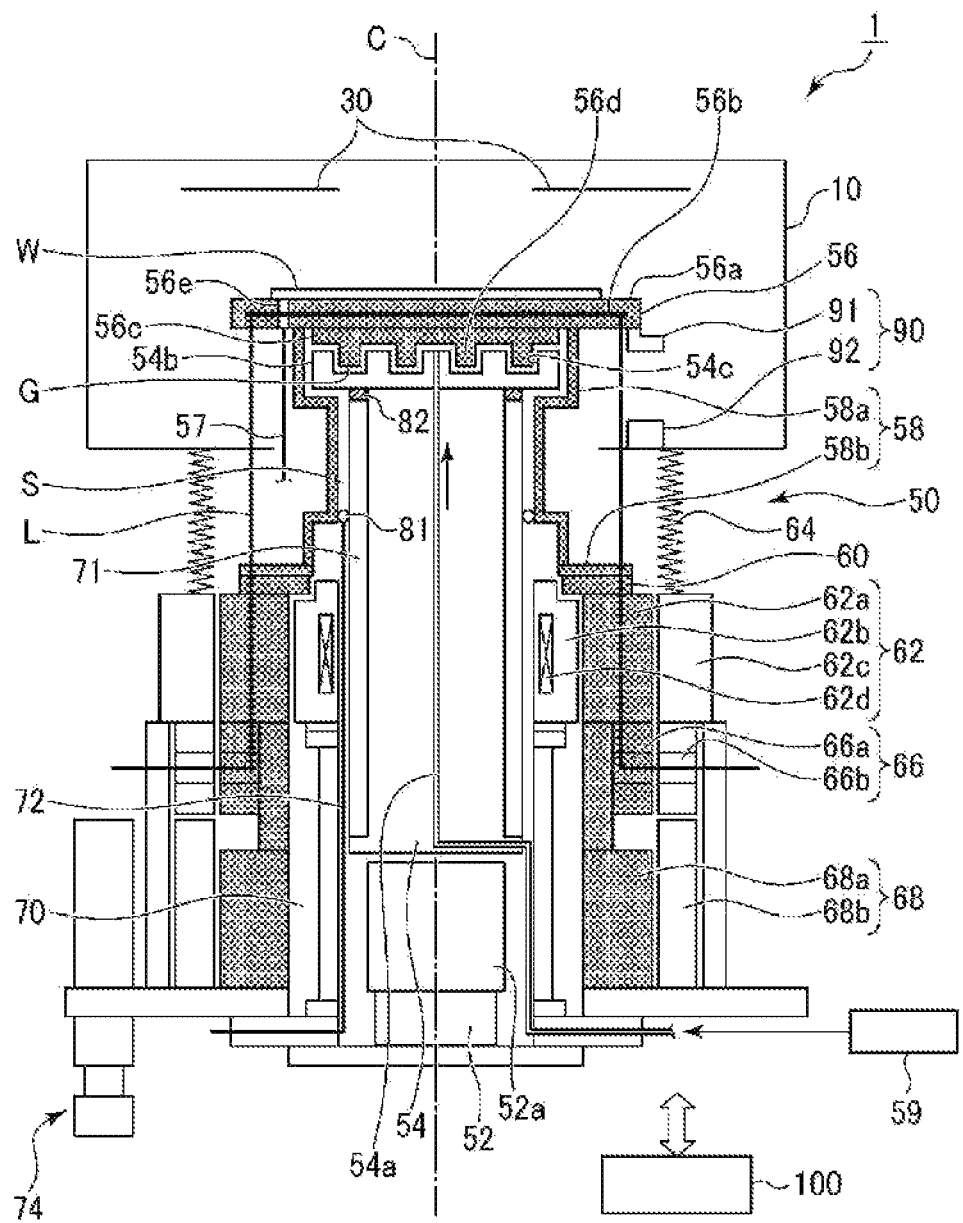
FIG. 1 is a schematic cross-sectional view showing an example of a substrate processing device capable of performing a substrate processing method according to an embodiment.

First, an example of a substrate processing device capable of performing a substrate processing method according to an embodiment will be described. FIG. 1 is a schematic cross-sectional view showing an example of the substrate processing device.

As shown in FIG. 1, a substrate processing device 1 includes a processing chamber 10 that can be maintained in a vacuum state, a target 30, a stage device 50, and a controller 100. The substrate processing device 1 is configured as a film forming device capable of performing sputtering film formation of a magnetic film on a semiconductor wafer (hereinafter, simply referred to as "wafer") W that is a substrate in an ultra-high vacuum and ultra-low temperature environment in the processing chamber 10. The magnetic film is used for, e.g., a tunneling magneto resistance (TMR) element.

The processing chamber 10 processes the wafer W that is a substrate to be processed. An exhaust device (not shown) such as a vacuum pump capable of decreasing a pressure to an ultra-high vacuum level is connected to the processing chamber 10, so that the inside of the processing chamber 10 can be depressurized to an ultra-high vacuum state (e.g., $10^{-5}$ Pa or less). A gas supply line (not shown) from the outside is connected to the processing chamber 10 to supply a sputtering gas (e.g., noble gas such as argon (Ar) gas, krypton (Kr) gas, neon (Ne) gas, or nitrogen gas) required for sputtering film formation. Further, a loading/unloading port (not shown) for the wafer W is formed on a sidewall of the processing chamber 10, and can be opened and closed by a gate valve (not shown).

At an inner upper portion of the processing chamber 10, the target 30 is disposed above the wafer W held by the stage device 50 to face the wafer W. An AC voltage or a DC voltage is applied from a plasma generation power source (not shown) to the target 30. When an AC voltage or a DC voltage is applied from the plasma generation power source to the target 30 in a state where the sputtering gas is introduced into the processing chamber 10, plasma of the sputtering gas is produced in the processing chamber 10, and the target 30 is sputtered by ions in the plasma. Atoms or molecules of the sputtered target material are deposited on the surface of the wafer W held by the stage device 50. Although the number of targets 30 is not particularly limited, from the viewpoint that different films made of different materials can be formed by one substrate processing device 100, it is preferable that a plurality of targets are present. For example, in the case of depositing a magnetic film (film containing a ferromagnetic material such as Ni, Fe, Co, or the like), CoFe, FeNi, and NiFeCo can be used as the material of the target 30. Further, those materials containing another element can also be used as the material of the target 30.

As will be described later, the stage device 50 holds the wafer W on the stage 56, and cools the wafer W to an extremely low temperature via the stage 56 while rotating the stage 56 together with the wafer W. Further, as will be described later, the stage device 50 has an elevating mechanism 74 for raising and lowering the stage 56 and a temperature measuring mechanism 90 for measuring a temperature of the stage.

The controller 100 is a computer, and includes a main controller including a central processing unit (CPU) for controlling individual components of the substrate processing device, an input device, an output device, a display device, and a storage device. The main controller controls a voltage applied to the target 30 during sputtering, introduction of a sputtering gas, raising/lowering and rotation of the stage 56 to be described later, loading/unloading of the wafer W, introduction of a cooling gas to be described later, an operation of a chiller 52 to be described later, or the like. Further, the main controller executes an operation set in the substrate processing device 1 based on a processing recipe called from the storage medium of the storage device.

Next, the stage device 50 will be described in detail.

As shown in FIG. 1, the stage device 50 includes the stage 56, the elevating mechanism 74, and the temperature measuring mechanism 90. The stage device 50 further includes the chiller 52, a frozen heat transfer body 54, a stage support 58, a seal rotation mechanism 62, and a driving mechanism 68.

The elevating mechanism 74 is configured to move the wafer W among a transfer position for transferring the wafer W to the stage 56, a processing position for forming a film on the wafer W placed on the stage 56, and a temperature measurement position for measuring a temperature of the stage using a substrate transfer device. The transfer position is set to be lower than the processing position and the temperature measurement position, and the temperature measurement position is set to be lower than the processing position. Further, the elevating mechanism 74 can control the distance between the target 30 and the wafer W.

Figure 2:
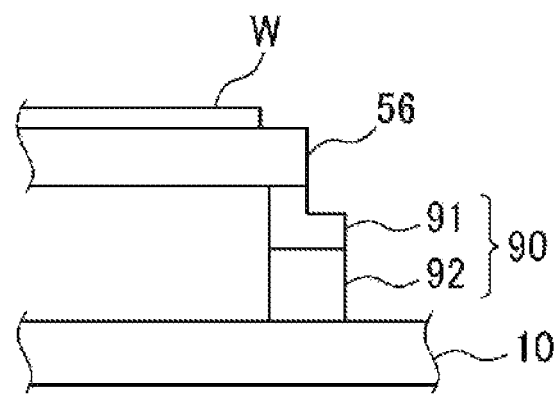
FIG. 2 is a cross-sectional view schematically showing a state in which a stage temperature is measured by a temperature measuring mechanism in the substrate processing device of FIG. 1.

The temperature measuring mechanism 90 includes a temperature detection contact portion 91 disposed at a portion of the stage 56 that does not interfere with the placement of the wafer W, and a temperature detector 92 attached to a bottom portion of the processing chamber 10 under the stage 56. The temperature detector 92 has a temperature sensor and is separated from the temperature detection contact portion except during temperature measurement. When the temperature detector 92 is in contact with the temperature detection contact portion 91, the temperature of the stage 56 can be measured. The temperature detection contact portion 91 can be brought into contact with and separated from the temperature detector 92 by raising and lowering the stage 56 using the elevating mechanism 74. As shown in FIG. 2, the positions of the temperature detection contact portion 91 and the temperature detector 92 are made to correspond to each other by rotating the stage 56, and the temperature of the stage 56 is measured by bringing the temperature detection contact portion 91 into contact with the temperature detector 92 by lowering the stage 56 to the temperature measurement position. Such temperature measurement is performed without rotating the stage 56 immediately before the wafer W is processed while rotating the stage 56, for example.

The chiller 52 holds the frozen heat transfer body 54 and cools an upper surface of the frozen heat transfer body 54 to an extremely low temperature. The chiller 52 has a cold head portion 52a at an upper portion thereof, and cold heat is transferred from the cold head portion 52a to the frozen heat transfer body 54. The chiller 52 preferably uses a Gifford-McMahon (GM) cycle in view of cooling performance. In the case of forming a magnetic film used for a TMR element, a cooling temperature of the frozen transfer body 54 by the chiller 52 is within a range of, e.g., 250K to 50K (−23° C. to −223° C.)

The frozen heat transfer body 54 is fixed on the chiller 52, and is formed in a substantially cylindrical shape and made of a material having high thermal conductivity such as pure copper (Cu) or the like. An upper portion of the frozen heat transfer body 54 is disposed in the processing chamber 10.

The frozen heat transfer body 54 is disposed below the stage 56 such that the center thereof coincides with a central axis C of the stage 56. A first cooling gas supply line 54a through which a first cooling gas can flow is formed along the central axis C inside the frozen heat transfer body 54, and a gas supply mechanism 59 is connected to the first cooling gas supply line 54a. The first cooling gas is supplied from the gas supply mechanism 59 to the first cooling gas supply line 54a. It is preferable to use helium (He) gas having high thermal conductivity as the first cooling gas.

The stage 56 is separated from the upper surface of the frozen heat transfer body 54 by a gap G (e.g., 2 mm or less). The stage 56 is made of a material having high thermal conductivity such as pure copper (Cu) or the like. The gap G communicates with the first cooling gas supply line 54a formed inside the frozen heat transfer body 54. Therefore, the extremely low temperature first cooling gas cooled by the frozen heat transfer body 54 is supplied from the gas supply mechanism 59 to the gap G through the first cooling gas supply line 54a. Accordingly, the cold heat of the chiller 52 is transferred to the stage 56 via the first cooling gas supplied to the frozen heat transfer body 54 and the gap G, thereby cooling the stage 56 to an extremely low temperature. The gas supply mechanism 59 can perform the removal of the first cooling gas from the gap G as well as the supply of the first cooling gas to the gap G.

The stage 56 includes an electrostatic chuck 56a. The electrostatic chuck 56a is formed of a dielectric film, and a chuck electrode 56b is embedded therein. A predetermined DC voltage is applied to the chuck electrode 56b through a wiring L. Accordingly, the wafer W can be attracted and fixed by an electrostatic attractive force.

The stage 56 has a first heat transfer portion 56c under the electrostatic chuck 56a, and convex portions 56d protruding toward the frozen heat transfer body 54 are formed on a bottom surface of the first heat transfer portion 56c. In the illustrated example, the convex portions 56d are formed as two annular portions surrounding the central axis C of the stage 56. The height of each convex portion 56d may be, e.g., 40 mm to 50 mm. The width of each convex portion 56d may be, e.g., 6 mm to 7 mm. Although the shape and number of the convex portions 56d are not particularly limited, it is preferable to set the shape and number thereof such that a sufficient heat exchangeable surface area can be obtained in order to increase the heat transfer efficiency with the frozen heat transfer body 54.

The frozen heat transfer body 54 has a second heat transfer portion 54b on an upper surface of the main body, i.e., on the surface facing the first heat transfer portion 56c. The second heat transfer portion 54b has concave portions 54c to be fitted into the convex portions 56d with the gap G interposed therebetween. In the illustrated example, the concave portions 54c are formed as two annular portions surrounding the central axis C of the stage 56. The height of each concave portion 54c may be the same as the height of each convex portion 56d, and may be, e.g., 40 mm to 50 mm. The width of each concave portion 54c may be slightly greater than the width of each convex portion 56d, and is preferably, e.g., 7 mm to 9 mm. The shape and number of the concave portions 54c are determined to correspond to those of the convex portions 56d.

The convex portions 56d of the first heat transfer portion 56c and the concave portions 54c of the second heat transfer portion 54b are fitted to each other via the gap G, thereby forming a comb teeth portion. Due to the presence of the comb teeth portion, the gap G is saw-toothed, so that the heat transfer efficiency of the first cooling gas between the first heat transfer portion 56c of the stage 56 and the second heat transfer portion 54b of the frozen heat transfer body 54 can be increased.

Figure 3:
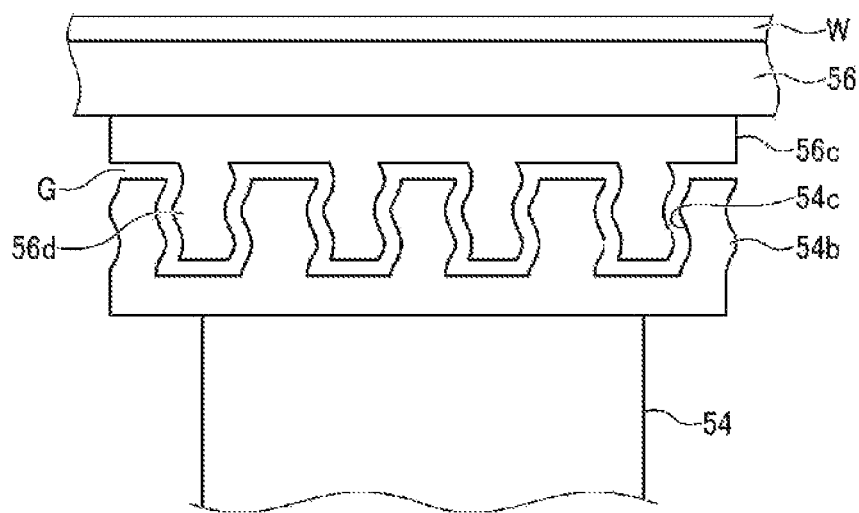
FIG. 3 schematically shows another example of a shape of a comb teeth portion in a stage device of the substrate processing device of FIG. 1.

As shown in FIG. 3, the convex portions 56d and the concave portions 54c may have corresponding wave shapes. Further, it is preferable that the surfaces of the convex portions 56d and the concave portions 54c are subjected to uneven processing by blasting or the like. Accordingly, the surface area for heat transfer can be increased to further improve the heat transfer efficiency.

Alternatively, the concave portions may be formed at the first heat transfer portion 56c, and the convex portions corresponding to the concave portions may be formed at the second heat transfer portion 54b.

The electrostatic chuck 56a and the first heat transfer portion 56c in the stage 56 may be integrally formed, or may be separately formed and joined. Further, the main body of the frozen heat transfer body 54 and the second heat transfer portion 54b may be integrally formed, or may be separately formed and joined.

The stage 56 has a through-hole 56e penetrating therethrough vertically. A second cooling gas supply line 57 is connected to the through-hole 56e, and a second cooling gas for heat transfer is supplied from the second cooling gas supply line 57 to the backside of the wafer W through the through-hole 56e. Similarly to the first cooling gas, He gas having high thermal conductivity is preferably used as the second cooling gas. By supplying the second cooling gas to the backside of the wafer W, i.e., to the gap between the wafer W and the electrostatic chuck 56a, the cold heat of the stage 56 can be efficiently transferred to the wafer W via the second cooling gas. Although one through-hole 56e may be formed, it is preferable to form a plurality of through-holes 56e in order to particularly efficiently transfer the cold heat of the frozen heat transfer body 54 to the wafer W.

By separating the flow path of the second cooling gas supplied to the backside of the wafer W from the flow path of the first cooling gas supplied to the gap G, the cooling gas can be supplied at a desired pressure and a desired flow rate to the backside of the wafer W regardless of the supply of the first cooling gas. At the same time, the cooling gas in a high pressure and extremely low temperature state can be continuously supplied to the gap G without being limited by the pressure, the flow rate, and the supply timing of the gas supplied to the backside.

Further, the stage 56 may have a through-hole connected from the gap G, so that a part of the first cooling gas may be supplied as the cooling gas to the backside of the wafer W.

The stage support 58 is disposed at an outer side of the frozen heat transfer body 54 and rotatably supports the stage 56. The stage support 58 has a substantially cylindrical main body 58a and a flange portion 58b extending outward on a bottom surface of the main body 58a. The main body 58a is disposed to cover the gap G and an upper outer peripheral surface of the frozen heat transfer body 54. Accordingly, the stage support 58 also has a function of shielding the gap G that is a connection portion between the frozen heat transfer body 54 and the stage 56.

The seal rotation mechanism 62 is disposed below a heat insulating member 60. The seal rotation mechanism 62 has a rotating portion 62a, an inner fixing portion 62b, an outer fixing portion 62c, and a heating device 62d.

The rotating portion 62a has a substantially cylindrical shape extending downward coaxially with the heat insulating member 60, and is rotated by the driving device 68 while being hermetically sealed with a magnetic fluid with respect to the inner fixing portion 62b and the outer fixing portion 62c. Since the rotating portion 62a is connected to the stage support 58 via the heat insulating member 60, the transfer of the cold heat from the stage support 58 to the rotating portion 62a is blocked by the heat insulating member 60. Therefore, it is possible to suppress deterioration of the sealing performance or occurrence of condensation caused by a decrease in the temperature of the magnetic fluid of the seal rotation mechanism 62.

The inner fixing portion 62b has a substantially cylindrical shape having an inner diameter greater than an outer diameter of the frozen heat transfer body 54 and having an outer diameter is smaller than the inner diameter of the rotating portion 62a. The inner fixing portion 62b is disposed between the frozen heat transfer body 54 and the rotating portion 62a via a magnetic fluid.

The outer fixing portion 62c has a substantially cylindrical shape having an inner diameter greater than an outer diameter of the rotating portion 62a, and is disposed at an outer side of the rotating portion 62a via a magnetic fluid.

The heating device 62d is embedded in the inner fixing portion 62b and heats the entire seal rotation mechanism 62. Accordingly, it is possible to suppress the deterioration of the sealing performance or the occurrence of condensation caused by a decrease in the temperature of the magnetic fluid of the seal rotation mechanism 62.

With such a configuration, the seal rotation mechanism 62 can rotate the stage support 58 in a state where a region communicating with the processing chamber 10 is hermetically sealed with a magnetic fluid and held in a vacuum state.

A bellows 64 is disposed between an upper surface of the outer fixing portion 62c and a bottom surface of the processing chamber 10. The bellows 64 is a metal bellows structure that can be extended and contracted vertically. The bellows 64 surrounds the frozen heat transfer body 54, the stage support 58, and the heat insulating member 60, and separates the space in the processing chamber 10 and the space communicating therewith and held in a vacuum state from a space in an atmospheric atmosphere.

A slip ring 66 is disposed below the seal rotation mechanism 62. The slip ring 66 has a rotating body 66a including a metal ring, and a fixed body 66b including a brush. The rotating body 66a is fixed to a bottom surface of the rotating portion 62a of the seal rotating mechanism 62, and has a substantially cylindrical shape extending downward coaxially with the rotating portion 62a. The fixed body 66b has a substantially cylindrical shape having an inner diameter slightly greater than an outer diameter of the rotating body 66a.

The slip ring 66 is electrically connected to a DC power supply (not shown), and a voltage supplied from the DC power supply is transmitted to the wiring L via the brush of the fixed body 66b and the metal ring of the rotating body 66a. Accordingly, a voltage can be applied from the DC power supply to the chuck electrode without causing torsion or the like in the wiring L. The rotating body 66a of the slip ring 66 is configured to rotate via the driving mechanism 68.

The driving mechanism 68 is a direct drive motor having a rotor 68a and a stator 68b. The rotor 68a has a substantially cylindrical shape extending coaxially with the rotating body 66a of the slip ring 66, and is fixed to the rotating body 66a. The stator 68b is formed in a substantially cylindrical shape having an inner diameter greater than an outer diameter of the rotor 68a. When the driving mechanism 68 is driven, the rotor 68a rotates, and the rotation of the rotor 68a is transmitted to the stage 56 via the rotating body 66a, the rotating portion 62a, and the stage support 58. Then, the stage 56 and the wafer W thereon are rotated with respect to the frozen heat transfer body 54. In FIG. 1, for convenience, the rotating members are hatched with dots.

Although the direct drive motor is illustrated as an example of the driving mechanism 68, the driving mechanism 68 may be driven via a belt or the like.

A first insulation structure 70 that is a vacuum insulation structure (vacuum double tube structure) formed in a cylindrical shape of a double tube structure and having an inner space maintained in a vacuum state is disposed to cover the cold head portion 52a of the chiller 52 and the lower portion of the frozen heat transfer body 54. The first heat insulation structure 70 can suppress the deterioration of the cooling performance caused by heat input from the outside such as the driving mechanism 68 or the like into the cold head portion 52a and the lower portion of the frozen heat transfer body 54 that are important for cooling the stage 56 and the wafer W.

Further, a second insulation structure 71 that is a cylindrical vacuum double tube structure having an inner space maintained in a vacuum state is disposed to cover substantially the entire frozen heat transfer body 54 and to overlap the inner side of the first heat insulation structure 70. The second insulation structure 71 can suppress the deterioration of the cooling performance caused by heat input from the outside such as the magnetic fluid seal, the first cooling gas leaking to the space S, or the like into the frozen heat transfer body 54. Since the first heat insulation structure 70 and the second heat insulation structure 71 overlap at the lower portion of the frozen heat transfer body 54, a non-insulated portion of the frozen heat transfer body 54 can be eliminated, and the insulation at the cold head portion 52a and its vicinity can be enhanced.

Further, the first heat insulation structure 70 and the second heat insulation structure 71 can suppress the transfer of cold heat of the chiller 52 and the frozen heat transfer body 54 to the outside.

A sealing member 81 is disposed between the main body 58a of the stage support 58 and the second heat insulation structure 71. A space S sealed with a sealing member 81 is formed by the main body 58a of the stage support 58, the second heat transfer portion 54b of the frozen heat transfer body 54, and the upper portion of and the second heat insulation structure 71. The first cooling gas leaking from the gap G flows into the space S. A gas flow path 72 is connected to the space S while penetrating through the sealing member 81. The gas flow path 72 extends downward from the space S. A space between an upper surface of the second heat insulation structure 71 and the second heat transfer portion 54b of the frozen heat transfer body 54 is sealed with a sealing member 82. The sealing member 82 suppresses the supply of the first cooling gas leaking into the space S to the main body of the frozen heat transfer body 54.

The gas flow path 72 may allow the gas in the space S to be discharged, or may allow the cooling gas to be supplied to the space S. In both cases where the gas is discharged through the gas flow path 72 and where the cooling gas is supplied through the gas flow path 73, it is possible to prevent deterioration of the sealing performance caused by a decrease in the temperature of the magnetic fluid due to the inflow of the first cooling gas from into the seal rotation mechanism 62. When the gas flow path 72 has the cooling gas supply function, the third cooling gas is supplied to function as a counterflow to the first cooling gas leaking from the gap G. It is preferable that a supply pressure of the third cooling gas is substantially the same as or slightly higher than a supply pressure of the first cooling gas in order to enhance the function as the counterflow. The condensation can be prevented by using a gas having thermal conductivity lower than that of the first cooling gas, such as argon (Ar) gas or neon (Ne) gas, as the third cooling gas.

<Substrate Processing Method>

Next, a substrate processing method performed in the substrate processing device 1 will be described.

In the case of processing the wafer W in a normal state, the processing chamber 10 is evacuated, and the chiller 52 of the stage device 50 operates. At the same time, the first cooling gas is supplied to the gap G through the first cooling gas flow path 54a. Accordingly, the cold heat transferred from the chiller 52 maintained at an extremely low temperature to the frozen heat transfer body is transferred to the stage 56 via the first cooling gas supplied to the gap G, and the rotatable stage 56 is maintained at a steady cooling temperature within a fixed range.

Then, the elevating mechanism 74 moves (lowers) the stage device 50 such that the stage 56 is located at the transfer position. Thus, the wafer maintained at a specific temperature (e.g., 75° C.) higher than room temperature is transferred from a vacuum transfer chamber (not shown) into the processing chamber 10 and placed on the stage 56 by a substrate transfer device (not shown). Next, a pressure in the processing chamber 10 is adjusted to an ultra-high vacuum (e.g., $10^{-5}$ Pa or less) that is a processing pressure, and a DC voltage is applied to the chuck electrode 56b to electrostatically attract the wafer W on the electrostatic chuck 56a. The second cooling gas is supplied to the backside of the wafer W, and the wafer W is maintained at the same temperature as that of the stage 56. In that case, since the stage 56 is separated from the fixed frozen heat transfer body 54, the wafer W can be rotated by the driving mechanism 68 via the stage support 58 while cooling the stage 56 and the wafer W.

In a state where the wafer W is rotated, a sputtering gas is introduced into the processing chamber 10, and a voltage is applied from a plasma generation power source (not shown) to the target 30. Accordingly, plasma of the sputtering gas is generated, and the target 30 is sputtered by ions in the plasma. Atoms or molecules of the sputtered target material are deposited on the surface of the wafer W held in an extremely low temperature state by the stage device 50, thereby forming a desired film, e.g., a magnetic film for use in a TMR element having a high magnetoresistance ratio. The temperature of the stage 56 can be monitored by the temperature measuring mechanism 90 when the stage 56 is not rotating.

Such a series of processes are continuously performed on a plurality of wafers W. However, it was found that in the process of continuously processing the wafers W at the time of starting processing, the stage temperature is gradually increased and saturated at a steady cooling temperature within a fixed range.

Figure 4:
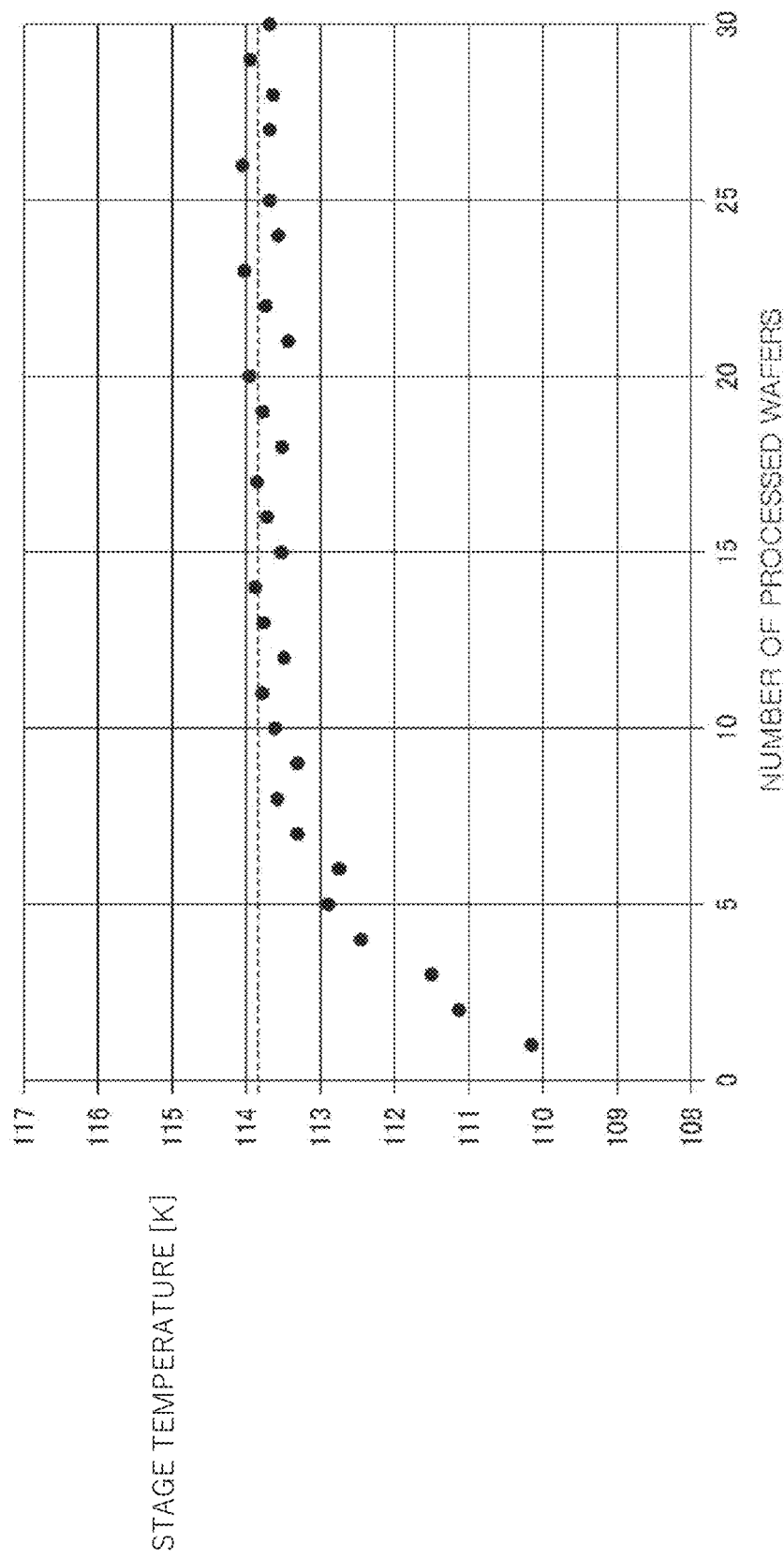
FIG. 4 shows a change in a stage temperature depending on the number of processed wafers in the case of processing a wafer that is a substrate by a conventional method in the substrate processing device of FIG. 1.

This may be because indirect cooling in which a cooling gas is supplied to a space between the frozen heat transfer body 54 and the rotating stage 56 to rotate and cool the wafer W to an extremely low temperature is employed and also because the temperature measuring mechanism 90 cannot monitor a temperature during the rotation of the stage 56. In other words, in the case of performing indirect cooling using a cooling gas, if the wafers W maintained at room temperature or higher are continuously processed at the time of starting processing, the phenomenon that the temperature of the stage 56 is gradually increased due to heat received from the wafers W occurs. During the rotation of the stage 56, the temperature cannot be monitored and, thus, the temperature cannot be controlled. Accordingly, it is difficult to correct such phenomenon. The temperature of the stage 56 is saturated at a steady cooling temperature within a fixed range because the heat received from the substrate and the cold heat supplied to the stage 56 via the cooling gas are balanced. In this case, the temperature continues to increase to the steady cooling temperature until several to several tens of wafers W are processed after the start of processing, which makes the temperature management of the wafer W difficult. Such phenomenon is remarkable particularly when the cooling temperature of the wafer W is about 120 K (−153° C.) or less. Specifically, as shown in FIG. 4, for example, the stage temperature is managed by the frozen heat transfer body 54 within a range of the center temperature ±1K and reaches the steady cooling temperature. However, the stage temperature is lower than the steady cooling temperature by about 3° C. to 4° C. at the time of starting processing, and is saturated at the steady cooling temperature when about ten wafers W are processed. FIG. 4 plots the average value of the stage (electrostatic chuck) temperature during processing that is measured by a thermocouple when the control temperature of the frozen heat transfer body 54 is 95K (−178° C.) and the wafer temperature is 75° C.

Conventionally, there is a problem that about ten wafers W whose temperatures are not controlled are processed from the start of processing. Therefore, a processing method capable of shortening a time required until the temperature reaches the steady cooling temperature (steady cooling temperature arrival time) is required.

Figure 5:
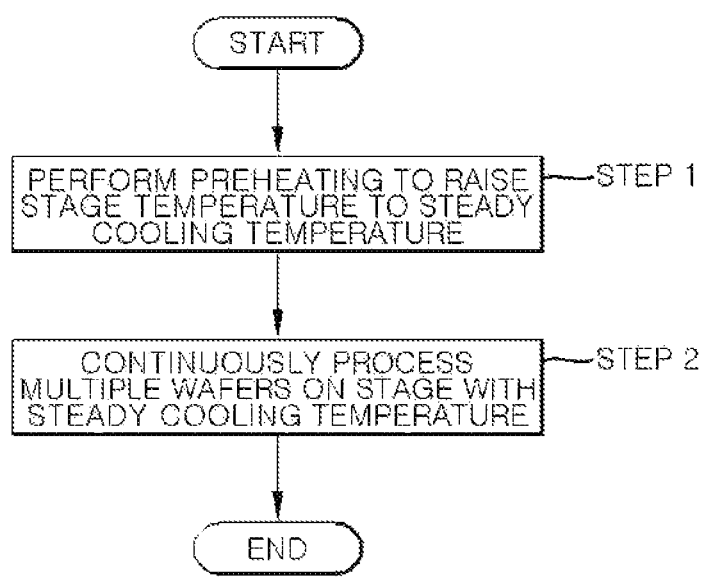
FIG. 5 is a flowchart showing a substrate processing method according to an embodiment.

Therefore, in one embodiment, as shown in FIG. 5, before the processing of the wafer W that is a substrate is started, first, preheating is performed to increase the temperature of the stage 56 to the steady cooling temperature (step 1) and, then, multiple wafers W are continuously processed on the stage 56 that has reached the steady cooling temperature (step 2).

Such a processing sequence is executed based on a processing recipe preset in the controller 100. In other words, a preheating time required until the temperature reaches the steady cooling temperature or the like is obtained in advance, and the processing recipe is stored in the storage device of the controller 100 based on the preheating time or the like. Then, the processing is performed based on the processing recipe.

By performing the preheating process of step 1, the temperature of the stage 56 can be rapidly increased to the steady cooling temperature.

Figure 6:
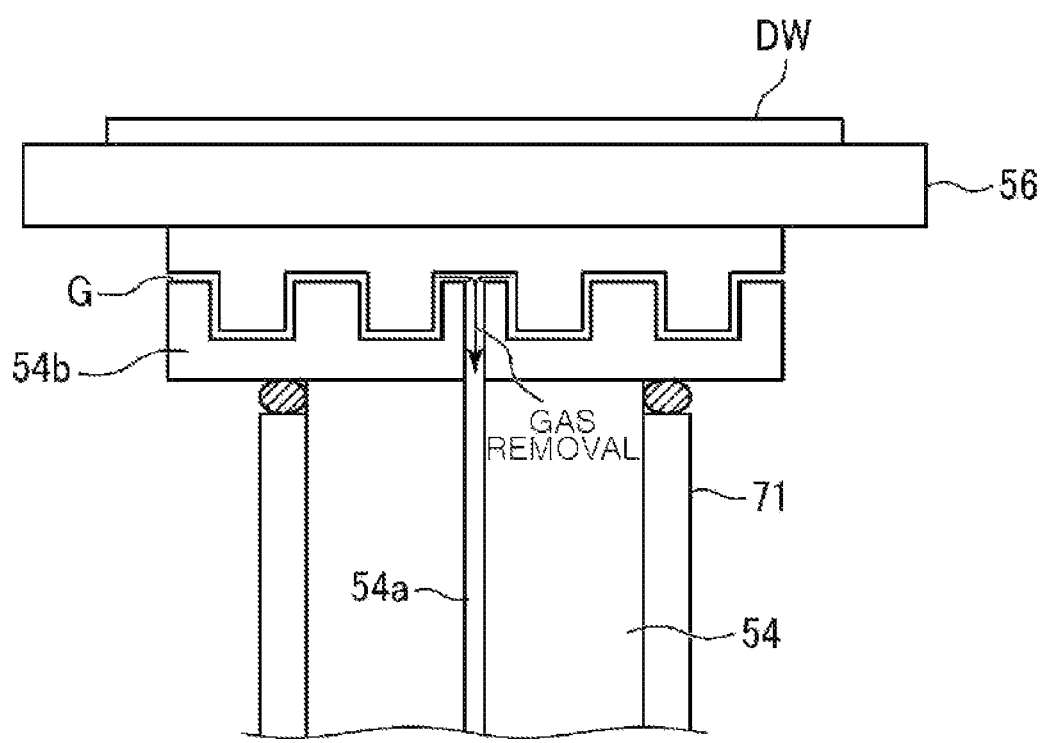
FIG. 6 explains an example of a preheating step of the substrate processing method according to the embodiment.

In the preheating of step 1, as shown in FIG. 6, the first cooling gas is removed from the gap G between the stage 56 and the frozen heat transfer body 54, and a dummy wafer DW heated to the same temperature as that of an actual device wafer is placed on the stage 56 and processed. The dummy wafer DW can be transferred by the same substrate transfer mechanism as that used for the wafer W.

By removing the first cooling gas from the gap G, the cooling of the stage 56 is blocked, and the stage 56 is heated by heat received from the dummy wafer having the same temperature as that of the actual device wafer. By processing about one to three dummy wafers, the temperature of the stage 56 can be stabilized at the steady cooling temperature, which makes it possible to considerably shorten the time required until the temperature of the stage 56 reaches the steady cooling temperature compared to the conventional case.

When the stage temperature reaches the steady cooling temperature by performing preheating, the first cooling gas is introduced into the gap G to start cooling of the stage 56, and the processing of the actual device wafer (wafer W) in step 2 is continuously performed on a plurality of wafers W. The processing performed in this case is the same as that described above. In the case of continuously processing the actual device wafers in a state where the stage temperature has reached the steady cooling temperature, the variation in the stage temperature can be maintained within a range of ±1K, for example, as described above.

The dummy wafer used for preheating preferably has the same temperature as that of the actual device wafer subjected to dummy processing under the same conditions as those applied to the actual device wafer. Further, it is preferable that the dummy processing of the dummy wafer in the substrate processing device 1 is performed under the same conditions as those applied to the actual device wafer.

In the case of performing preheating using the dummy wafer whose temperature is the same as that of the actual device wafer, the dummy wafer can be processed during the preheating under the same conditions as those of other actual processing except that the first cooling gas is removed from the gap G. Therefore, it is highly compatible with the actual processing.

Figure 7:
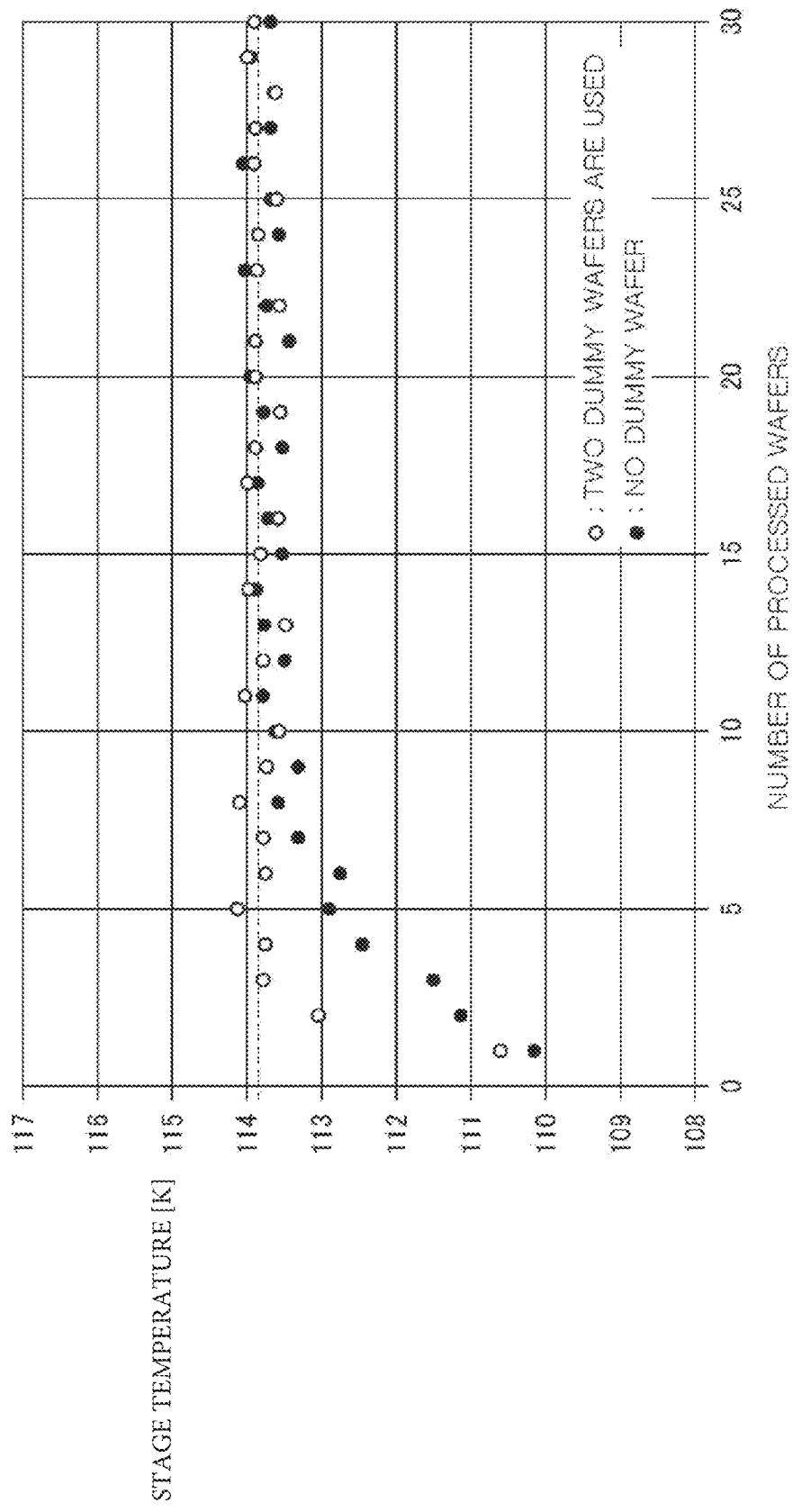
FIG. 7 shows changes in a stage temperature depending on the number of processed wafers in the case of processing a wafer that is a substrate by the substrate processing method according to an embodiment and the conventional method in the substrate processing device of FIG. 1.

Next, a result of monitoring a change in the stage temperature in the case of performing preheating and then continuously processing the actual device wafers will be described. Here, the preheating of the stage was performed by continuously processing two dummy wafers heated to 75° C. equal to the temperature of the actual device wafer in a state where the first cooling gas was removed from the gap G and, then, the first cooling gas was supplied to continuously process the actual device wafers. FIG. 7 shows a relationship between the number of processed wafers and the stage temperature in that case. FIG. 7 also shows, for comparison, a result of processing using a conventional method in which the dummy wafer shown in FIG. 4 is not used. Similarly to FIG. 4, FIG. 7 plots the average value of the temperature of the stage (the electrostatic chuck) during processing that is measured by a thermocouple when the control temperature of the frozen heat transfer body 54 is 95 K (−178° C.) and the wafer temperature is 75° C.

As shown in FIG. 7, it was found that by processing two dummy wafers in a state where the first cooling gas is removed, the processing is performed within a management temperature range (steady cooling temperature) in subsequent processing of the actual device wafer. Since the processing time of one wafer is predetermined, the time required to reach the steady cooling temperature is considerably shortened compared to when the dummy wafer is not processed. Specifically, when the dummy wafer is not used, it is necessary to process about 10 wafers until the temperature reaches the steady cooling temperature. Therefore, the time required to reach the steady cooling temperature is shortened to about ¼ to ⅕ by the present method.

The preheating process of step 1 is not necessarily performed by the technique using the dummy wafer having the same temperature as that of the actual device wafer as long as the stage 56 can be preheated to the steady cooling temperature, and may be performed by various techniques.

For example, the dummy processing may be performed using a dummy wafer having a temperature higher than that of the actual device wafer. Further, the stage may be heated by a heater. Accordingly, the preheating can be performed with an enhanced heating effect. In such cases, the effect of shortening the steady cooling temperature arrival time can be obtained without removing the first cooling gas from the gap G. Also in such cases, the steady cooling temperature arrival time can be further shortened by removing the first cooling gas from the gap G.

Figure 8:
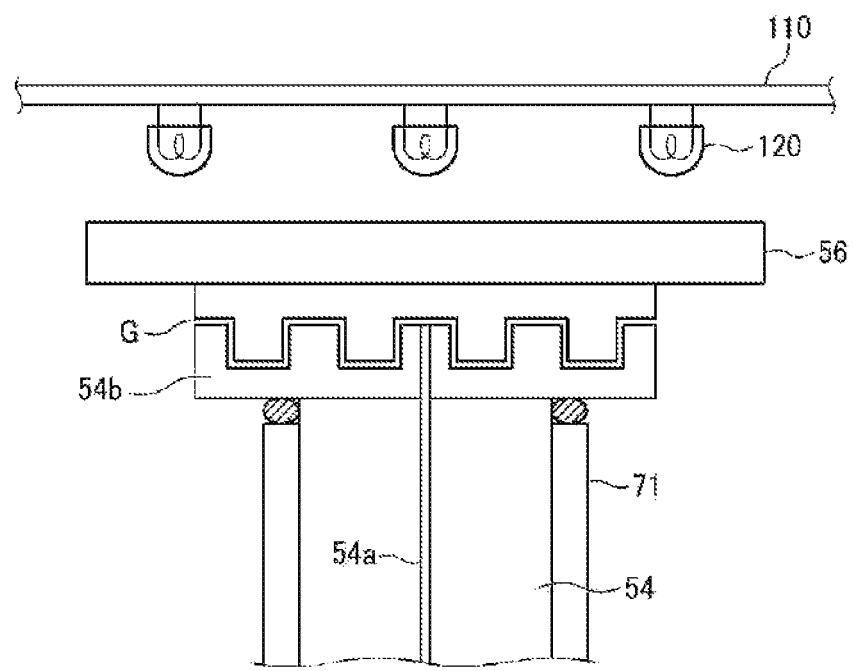
FIG. 8 explains another example of the preheating step.
Figure 9:
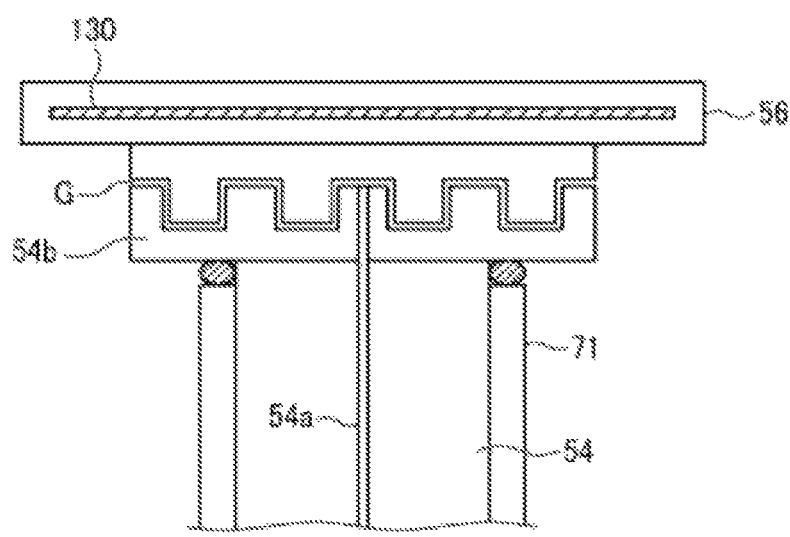
FIG. 9 explains still another example of the preheating step.

As a technique for heating the stage 56 using a heater, there may be used a technique for performing heating by providing a lamp heater 120 at a movable shutter 110 for shielding sputtered particles from the target 30, which is generally used in a sputtering device, as shown in FIG. 8. Further, as shown in FIG. 9, a technique for performing heating by providing a resistance heater 130 at the stage 56 may also be used.

OTHER APPLICATIONS

While the embodiments of the present disclosure have been described, the embodiments of the present disclosure are illustrative in all respects and are not restrictive. The above-described embodiments may be omitted, replaced, or changed in various forms without departing from the scope of the appended claims and the gist thereof.

For example, in the above embodiment, sputtering film formation of a magnetic film for use in a TMR element has been described as an example of substrate processing. However, the present disclosure is not limited to the above embodiment as long as the substrate is rotated and processed while indirectly cooling the stage holding the substrate using a cooling gas.

Further, although an example in which a semiconductor wafer is used as a substrate has been described in the above embodiment, the substrate is not limited to the semiconductor wafer and may be another substrate such as a flat panel display (FPD) substrate, a ceramic substrate, or the like.

DESCRIPTION OF REFERENCE NUMERALS

1: substrate processing device
10: processing chamber
30: target
50: stage device
52: chiller
54: frozen heat transfer body
54a: first cooling gas supply line
56: stage
74: elevating mechanism
90: temperature measuring mechanism
100: controller
110: shutter
G: gap
W: wafer (substrate)

The invention claimed is:
1. A method for processing a substrate, comprising:
preparing a substrate processing device including a rotatable stage on which a substrate is placed, a frozen heat transfer body fixed on a backside of the stage with a gap interposed therebetween and cooled to an extremely low temperature, a gas supply mechanism configured to supply to the gap a cooling gas for transferring a cold heat of the frozen heat transfer body to the stage, a rotation mechanism configured to rotate the stage, and a processing mechanism configured to process the substrate; and
controlling the substrate processing device by a controller, wherein the controller is configured to:
  cool the stage to an extremely low temperature by supplying the cooling gas to the gap between the stage and the frozen heat transfer body without the substrate being disposed on the stage,
  after the stage is cooled to the extremely low temperature and before the the substrate is placed on the stage, preheat the stage to increase a temperature of the stage from the extremely low temperature to a steady cooling temperature within a fixed range that is greater than the extremely low temperature; and
  after the stage is preheated to the steady cooling temperature, continuously process each of a plurality of substrates by the processing mechanism while rotating the stage that has reached the steady cooling temperature in a state where the substrate on the stage has a specific temperature higher than or equal to room temperature is placed on the stage.

2. The method of claim 1, wherein preheating comprises placing a dummy substrate having the same temperature as a temperature of the substrate on the stage thereby increasing the temperature of the stage, removing the cooling as from the gap, and performing dummy processing after the cooling gas is removed from the gap.

3. The method of claim 2, wherein preheating comprises performing dummy processing on one to three dummy substrates.

4. The method of claim 2, wherein the dummy processing is performed under the same conditions as conditions of actual processing of the substrate.

5. The method of claim 1, wherein preheating comprises placing a dummy substrate having a temperature higher than a temperature of the substrate on the stage thereby increasing the temperature of the stage and performing dummy processing.

6. The method of claim 5, wherein preheating comprises removing the cooling gas from the gap.

7. The method of claim 1, wherein preheating comprises heating the stage using a heater.

8. The method of claim 7, wherein the heater is a lamp heater disposed above the stage or a resistance heater disposed at the stage.

9. The method of claim 7, wherein preheating comprises removing the cooling gas from the gap.

10. The method of claim 1, wherein the substrate processing is sputtering film formation in which sputtered particles from a target disposed above the stage in a vacuum chamber are deposited on the substrate in a vacuum state.

11. A device for processing a substrate, comprising:
a rotatable stage on which a substrate is placed;
a frozen heat transfer body fixed on a backside of the stage with a gap interposed therebetween and cooled to an extremely low temperature;
a gas supply mechanism configured to supply to the gap a cooling gas for transferring cold heat of the frozen heat transfer body to the stage;
a rotation mechanism configured to rotate the stage;
a processing mechanism configured to process the substrate; and
a controller,
wherein the controller is configured to:
cool the stage to an extremely low temperature by supplying the cooling gas to the gap between the stage and the frozen heat transfer body without the substrate being disposed on the stage,
after the stage is cooled to the extremely low temperature and before the the substrate is placed on the stage, preheat the stage to increase a temperature of the stage from the extremely low temperature to a steady cooling temperature within a fixed range that is greater than the extremely low temperature; and
after the stage is preheated to the steady cooling temperature, continuously process each of a plurality of substrates by the processing mechanism while rotating the stage that has reached the steady cooling temperature in a state where the substrate on the stage has a specific temperature higher than or equal to room temperature is placed on the stage.

12. The device of claim 11, wherein the controller controls the device such that the preheating is performed by placing a dummy substrate having the same temperature as a temperature of the substrate on the stage thereby increasing the temperature of the stage, the cooling gas is removed from the gap, and dummy processing is performed after the cooling gas is removed from the gap.

13. The device of claim 12, wherein the controller controls the device such that the preheating is performed by performing dummy processing on one to three dummy substrates.

14. The device of claim 12, wherein the controller controls the device such that the dummy processing is performed under the same conditions as conditions of actual processing of the substrate.

15. The device of claim 11, wherein the controller controls the device such that the preheating is performed by placing a dummy substrate having a temperature higher than a temperature of the substrate on the stage and performing dummy processing thereby increasing the temperature of the stage.

16. The device of claim 15, wherein the controller controls the device such that the preheating is performed after the cooling gas is removed from the gap.

17. The device of claim 11, wherein the controller controls the device such that the preheating is performed by heating the stage using a heater.

18. The device of claim 17, wherein the heater is a lamp heater disposed above the stage or a resistance heater disposed at the stage.

19. The device of claim 17, wherein the controller controls the device such that the preheating is performed in a state where the cooling gas is removed from the gap.

20. The device of claim 11, wherein the processing mechanism has a vacuum chamber accommodating the stage and a target accommodated in the vacuum chamber, and performs sputtering film formation in which sputtered particles from the target are deposited on the substrate in a vacuum state.

* * * * *